United States Patent
Lee et al.

(10) Patent No.: US 12,168,837 B2
(45) Date of Patent: Dec. 17, 2024

(54) TIN-SILVER PLATING SOLUTION AND METHOD FOR FORMING TIN-SILVER SOLDER BUMP BY USING SAME

(71) Applicants: KOREA INSTITUTE OF INDUSTRIAL TECHNOLOGY, Cheonan-si (KR); DONGWOO FINE-CHEM CO., LTD., Iksan-si (KR)

(72) Inventors: Min Hyung Lee, Incheon (KR); Woon Young Lee, Incheon (KR); Sang Hoon Jin, Seoul (KR); Yu Geun Jo, Incheon (KR); Dong Ryul Lee, Incheon (KR)

(73) Assignees: Korea Institute of Industrial Technology, Cheonan-si (KR); Dongwoo Fine-Chem Co., Ltd., Iksan-si (KR)

( * ) Notice: Subject to any disclaimer, the term of this patent is extended or adjusted under 35 U.S.C. 154(b) by 0 days.

(21) Appl. No.: 18/253,540

(22) PCT Filed: Nov. 17, 2021

(86) PCT No.: PCT/KR2021/016859
§ 371 (c)(1),
(2) Date: May 18, 2023

(87) PCT Pub. No.: WO2022/108325
PCT Pub. Date: May 27, 2022

(65) Prior Publication Data
US 2023/0407508 A1     Dec. 21, 2023

(30) Foreign Application Priority Data
Nov. 20, 2020 (KR) .......................... 10-2020-0157071
Oct. 18, 2021 (KR) .......................... 10-2021-0138109

(51) Int. Cl.
*C25D 3/60* (2006.01)
*C25D 3/64* (2006.01)
(Continued)

(52) U.S. Cl.
CPC ................. *C25D 3/60* (2013.01); *H01L 24/11* (2013.01)

(58) Field of Classification Search
CPC ... C25D 3/56; C25D 3/60; C25D 3/64; C25D 5/02
(Continued)

(56) References Cited

U.S. PATENT DOCUMENTS

| | | | | |
|---|---|---|---|---|
| 6,099,713 | A * | 8/2000 | Yanada | C25D 3/60 |
| | | | | 106/1.23 |
| 7,628,903 | B1 * | 12/2009 | Tsuji | C25D 3/46 |
| | | | | 106/1.23 |
| 2018/0057953 | A1 * | 3/2018 | Watanabe | C25D 7/12 |

FOREIGN PATENT DOCUMENTS

| | | |
|---|---|---|
| JP | 2017-031447 A | 2/2017 |
| JP | 2017-179515 A | 10/2017 |

(Continued)

OTHER PUBLICATIONS

Qin et al., "Electrodeposition and Characterization of Eutectic Sn—Ag Alloy as Solder Bumps for Flip-Chip Interconnection," Journal of The Electrochemical Society (Aug. 20, 2009), vol. 156, No. 10, pp. D424-D430. (Year: 2009).*

*Primary Examiner* — Edna Wong
(74) *Attorney, Agent, or Firm* — Rabin & Berdo, P.C.

(57) ABSTRACT

As a tin-silver plating solution that contains a source of tin ions; a source of silver ions ($Ag^+$); and an organic additive including a silver (Ag) complexing agent, a tin carrier, and a crystal grain refiner is provided, in the case of performing high-speed plating using the plating solution, the generation of whiskers is diminished, the composition of silver ions (Continued)

($Ag^+$) in the tin-silver plating solution is uniformly maintained, and thus a uniform silver composition in the formed tin-silver solder bumps can be achieved.

11 Claims, 10 Drawing Sheets

(51) Int. Cl.
  *C25D 5/02* (2006.01)
  *H01L 23/00* (2006.01)
(58) Field of Classification Search
  USPC ................................ 205/238, 252, 253, 118
  See application file for complete search history.

(56) References Cited

FOREIGN PATENT DOCUMENTS

| | | |
|---|---|---|
| KR | 10-1175062 B1 | 8/2012 |
| KR | 10-2017-0131418 A | 11/2017 |
| KR | 10-2019-0018478 A | 2/2019 |

\* cited by examiner (a)

(b)

(a)

(b)

(a)

(b)

(a)

(b)

(a)

(b)

(a)

(b)

TIN-SILVER PLATING SOLUTION AND METHOD FOR FORMING TIN-SILVER SOLDER BUMP BY USING SAME

TECHNICAL FIELD

The present invention relates to a tin-silver plating solution, more particularly to a tin-silver plating solution plated on a substrate of an electronic part including a semiconductor device.

BACKGROUND ART

With the trend of miniaturization, thinning, increases in capacities, and enhancement of functions of electronic products, decreases in areas of circuit boards and the like, which are core parts of the electronic products, improvement in mounting areas of semiconductor devices, or the like is directly related to the competitiveness of the electronic products. Research and development are being conducted to improve mounting portions of semiconductor devices mounted on the circuit boards, namely mounting areas of the semiconductor devices.

Accordingly, in order to decrease the mounting area, a method in which a semiconductor device is directly mounted in the form of a bare chip has recently been used. As one of the bare chip mounting methods, flip chip mounting is mainly used.

There are various types of flip chip packages, and flip chip package technology using solder bumps has advantages that solder bumps between circuit boards are directly jointed, the number of input/output terminals per unit area is greatly increased by an area array method utilizing the entire area of the chip, and it is thus possible to apply fine pitches, increase the speed, reduce the weight, and realize highly functional and high-performance products.

Conventionally, commonly used tin-lead solder bumps have the advantages of excellent soldering characteristics, low melting points, and ease of plating solution management, but the use of tin-lead solder bumps has been regulated with the implementation of the RoHS Act, which regulates the use of hazardous substances including lead. In addition, since whiskers are frequently generated in the reflow operation for making solder balls after solder bumps are plated with a tin plating solution, research to improve this has been continuously requested. Therefore, tin-based alloys such as tin-silver, tin-bismuth, tin-copper, and tin-zinc are being investigated as alternatives to tin-lead alloys.

Among these, tin-silver alloys are attracting attention due to advantages such as low resistivity, stability, ability to achieve a wide range of melting points, and elimination of alpha particle emission by pure Sn sources. However, in the manufacture of tin-silver solder bumps, silver ions ($Ag^+$) in the plating solution tend to be precipitated on a specific under bump metal (UBM) layer or tin anode plate by substitution, and this makes it difficult to control the concentration of silver ions ($Ag^+$) in the plating solution. In addition, when the tin-silver solder bump does not have an appropriate alloy composition ratio, whiskers or nodules may be generated and this may cause interconnection reliability problems in a flip chip.

Another problem in the manufacture of tin-silver solder bumps is that the current density at which plating is possible is limited. A high current density during plating increases the bump plating speed and has a positive effect on high throughput, but may have negative effects such as formation of voids in bumps due to poor plating since it is difficult to control the plating surface and excessive hydrogen gas is generated from the plating electrode.

Therefore, it is required to develop a tin-silver plating solution having a stable plating speed and a stable silver content under high-speed plating conditions and affording a smooth plating surface.

CITATION LIST

Patent Literature

[Patent Literature 1]
  Korean Patent No. 10-1175062

SUMMARY OF INVENTION

Technical Problem

An object of the present invention is to provide a tin-silver plating solution for diminishing whisker generation in high-speed plating and improving non-uniformity of silver composition in solder.

The technical object to be achieved by the present invention is not limited to the above-mentioned technical object, and other technical objects not mentioned will be clearly understood by those skilled in the art to which the present invention pertains from the description below.

Solution to Problem

In order to achieve the objects, an embodiment of the present invention provides a tin-silver plating solution containing a source of tin ions; a source of silver ions ($Ag^+$); and an organic additive, in which the organic additive includes a silver (Ag) complexing agent represented by the following Chemical Formula 1, a tin carrier represented by the following Chemical Formula 2, and a crystal grain refiner represented by the following Chemical Formula 3:

[Chem. 1]

Here, $A_1$ is a linear alkylene having 1 to 10 carbon atoms and $R_1$ and $R_2$ are each independently a functional group containing any one or more of carbon, oxygen, nitrogen, sulfur, or silicon.

[Chem. 2]

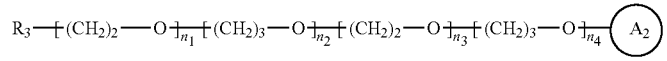

Here, $A_2$ is a substituted or unsubstituted $C_6$ to $C_{30}$ aryl group or a heteroaryl group having 6 to 30 ring atoms including a hetero atom in which one or more ring carbon atoms are each composed of any one or more of nitrogen, oxygen, or sulfur, $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation, and $n_1$ to $n_4$ are each independently an integer of 0 to 26, provided that a sum of $n_1$ to $n_4$ is 10 to 26.

[Chem. 3]

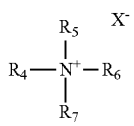

Here, $R_4$ is hydrogen, a linear alkyl having 1 to 20 carbon atoms, a branched alkyl having 5 to 20 carbon atoms, or a linear alkyl having 1 to 7 carbon atoms including a hydroxyl group; $R_5$ is hydrogen, a linear alkyl having 1 to 20 carbon atoms, a branched alkyl having 5 to 20 carbon atoms, or a linear alkyl having 1 to 7 carbon atoms including a hydroxyl group; $R_6$ is hydrogen, a linear alkyl having 1 to 20 carbon atoms, or a branched alkyl having 5 to 20 carbon atoms; $R_7$ is hydrogen, a linear alkyl having 1 to 20 carbon atoms, or a branched alkyl having 5 to 20 carbon atoms; and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

In an embodiment of the present invention, the tin-silver plating solution may be a tin-silver plating solution in which the source of tin ions includes any one or more water-soluble tin compounds selected from the group consisting of tin sulfate, tin hydrochloride, tin sulfamate, tin acetate, tin phosphate, tin methanesulfonate, tin gluconate, and tin carboxylate.

In an embodiment of the present invention, the tin-silver plating solution may be a tin-silver plating solution in which the source of silver ions ($Ag^+$) includes any one or more water-soluble silver (Ag) compounds selected from the group consisting of silver sulfate, silver hydrochloride, silver sulfamate, silver acetate, silver phosphate, silver methanesulfonate, silver gluconate, and silver carboxylate.

In an embodiment of the present invention, the tin-silver plating solution may be a tin-silver plating solution in which tin ions and silver ions ($Ag^+$) in the tin-silver plating solution are provided at a weight ratio of 75:25 to 99.9:0.1.

In an embodiment of the present invention, the tin-silver plating solution may be a tin-silver plating solution in which the source of silver ions ($Ag^+$) and the silver (Ag) complexing agent are provided at a molar ratio of 1:1 to 1:10.

In an embodiment of the present invention, the tin-silver plating solution may be a tin-silver plating solution, which further contains any one or more of a conductive salt, an antioxidant, or a smoothing agent.

At this time, the tin-silver plating solution may be a tin-silver plating solution in which the conductive salt is any one of a hydroxycarboxylic acid or an alkanesulfonic acid.

At this time, the tin-silver plating solution may be a tin-silver plating solution in which the antioxidant is any one or more selected from the group consisting of catecol, hydroquinone, resorcinol, cresol, phloroglucinol, oxy hydroquinone, and pyrogallol.

At this time, the tin-silver plating solution may be a tin-silver plating solution in which the smoothing agent is any one or more selected from the group consisting of a nonionic surface active agent, a cationic surface active agent, an anionic surface active agent, and a synthetic polymer.

In order to achieve the objects, another embodiment of the present invention provides a method of forming a tin-silver solder bump, including: exposing an under-bump-metallurgy structure to a plating bath containing a tin-silver plating solution that contains a source of tin ions; a source of silver ions ($Ag^+$); and an organic additive, the organic additive including a silver (Ag) complexing agent represented by the following Chemical Formula 1, a tin carrier represented by the following Chemical Formula 2, and a crystal grain refiner represented by the following Chemical Formula 3; and plating a tin-silver alloy on the under-bump-metallurgy structure by applying a current:

[Chem. 1]

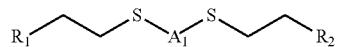

Here, $A_1$ is a linear alkylene having 1 to 10 carbon atoms and $R_1$ and $R_2$ are each a functional group containing any one or more of carbon, oxygen, nitrogen, sulfur, or silicon.

[Chem. 2]

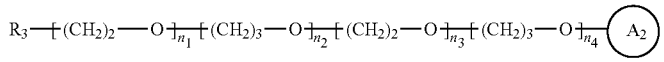

Here, $A_2$ is a substituted or unsubstituted $C_6$ to $C_{30}$ aryl group or a heteroaryl having 6 to 30 ring atoms including a hetero atom in which one or more ring carbon atoms are each composed of any one or more of nitrogen, oxygen, or sulfur; $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation; and $n_1$ to $n_4$ are each independently an integer of 0 to 26, provided that the sum of $n_1$ to $n_4$ is 10 to 26.

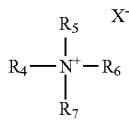

[Chem. 3]

Here, $R_4$ is hydrogen, a linear alkyl having 1 to 20 carbon atoms, a branched alkyl having 5 to 20 carbon atoms, or a linear alkyl having 1 to 7 carbon atoms including a hydroxyl group; $R_5$ is hydrogen, a linear alkyl having 1 to 20 carbon atoms, a branched alkyl having 5 to 20 carbon atoms, or a linear alkyl having 1 to 7 carbon atoms including a hydroxyl group; $R_6$ is hydrogen, a linear alkyl having 1 to 20 carbon atoms, or a branched alkyl having 5 to 20 carbon atoms; $R_7$ is hydrogen, a linear alkyl having 1 to 20 carbon atoms, or a branched alkyl having 5 to 20 carbon atoms; and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

In an embodiment of the present invention, the method of forming a tin-silver solder bump may be a method of forming a tin-silver solder bump in which the current applied in the step of plating a tin-silver alloy has a current density of 1 ASD to 10 ASD.

In order to achieve the objects, another embodiment of the present invention provides a tin-silver solder bump formed by the method described above.

Advantageous Effects of Invention

In the case of performing high-speed plating using the tin-silver plating solution according to an embodiment of the present invention as well, the generation of whiskers is diminished, the composition of silver ions ($Ag^+$) in the tin-silver plating solution is uniformly maintained, and thus a uniform silver composition in the formed tin-silver solder bumps can be achieved.

The method of forming a tin-silver solder bump of the present invention can perform high-speed plating at a high current density and thus can achieve high throughput.

Tin-silver solder bumps formed using the method of forming a tin-silver solder bump of the present invention can have a uniform bump height, improved surface roughness and solderability, and uniform content and distribution of silver (Ag) in the bumps, cause diminished whisker generation, and exhibit favorable reflow characteristics. Moreover, there is an effect of maintaining excellent processability and reliability of ultra-fine bumps.

The effects of the present invention are not limited to the effects mentioned above, and should be understood to include all effects that can be inferred from the detailed description of the present invention or the configuration of the invention described in the claims.

DESCRIPTION OF EMBODIMENTS

Figure 1:
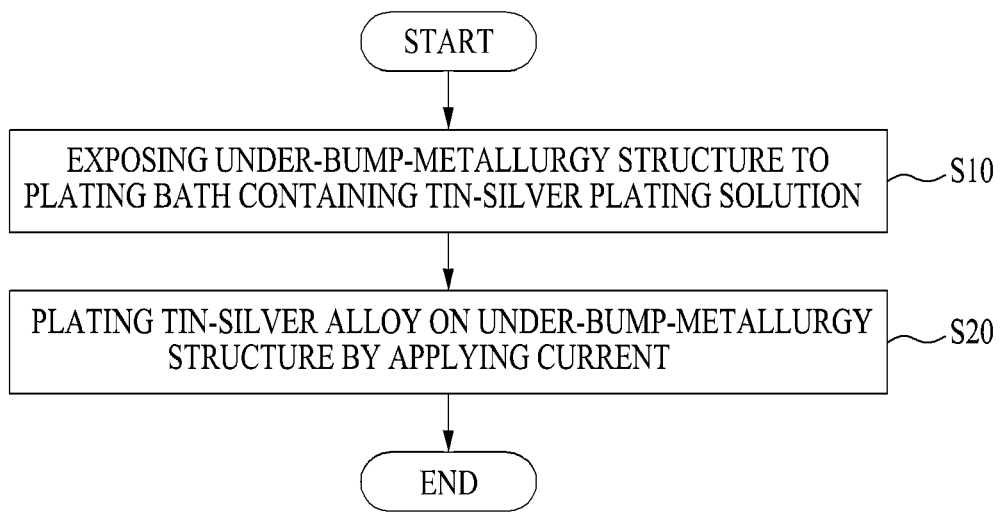
FIG. 1 is a flowchart of a method of forming a tin-silver solder bump according to the present invention.

Hereinafter, the present invention will be described with reference to the accompanying drawings. However, the present invention may be embodied in many different forms and, therefore, is not limited to the embodiments described herein.

Terms used in the present specification are only used to describe specific embodiments, and are not intended to limit the present invention. Singular expressions include plural expressions unless the context clearly dictates otherwise. In the present specification, it should be understood that terms such as "include" or "have" are intended to designate that features, numbers, steps, operations, components, parts, or combinations thereof described in the specification exist unless otherwise stated, but does not preclude the possibility of presence or addition of one or more other features, numbers, steps, operations, components, parts, or combinations thereof.

An aspect of the present invention provides a tin-silver plating solution containing a source of tin ions; a source of silver ions ($Ag^+$); and an organic additive, in which the organic additive includes a silver (Ag) complexing agent represented by the following Chemical Formula 1, a tin carrier represented by the following Chemical Formula 2, and a crystal grain refiner represented by the following Chemical Formula 3:

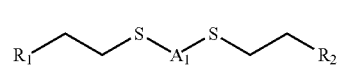

[Chem. 1]

Here, $A_1$ is a linear alkylene having 1 to 10 carbon atoms and $R_1$ and $R_2$ are each a functional group containing any one or more of carbon, oxygen, nitrogen, sulfur, or silicon.

[Chem. 2]

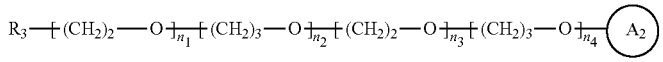

Here, $A_2$ is a substituted or unsubstituted $C_6$ to $C_{30}$ aryl group or a heteroaryl having 6 to 30 ring atoms including a hetero atom in which one or more ring carbon atoms are each composed of any one or more of nitrogen, oxygen, or sulfur; $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation; and $n_1$ to $n_4$ are each independently an integer of 0 to 26, provided that the sum of $n_1$ to $n_4$ is 10 to 26.

[Chem. 3]

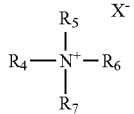

Here, $R_4$ is hydrogen, a linear alkyl having 1 to 20 carbon atoms, a branched alkyl having 5 to 20 carbon atoms, or a linear alkyl having 1 to 7 carbon atoms including a hydroxyl group; $R_5$ is hydrogen, a linear alkyl having 1 to 20 carbon atoms, a branched alkyl having 5 to 20 carbon atoms, or a linear alkyl having 1 to 7 carbon atoms including a hydroxyl group; $R_6$ is hydrogen, a linear alkyl having 1 to 20 carbon atoms, or a branched alkyl having 5 to 20 carbon atoms; $R_7$ is hydrogen, a linear alkyl having 1 to 20 carbon atoms, or a branched alkyl having 5 to 20 carbon atoms; and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

As regulations have recently become stricter in association with environmental problems caused by lead, interest in lead-free solders is growing, and pure tin, tin-copper, tin-silver and ternary tin alloys have been investigated as potential alternatives to conventionally used tin-lead alloys.

Among these, tin-silver alloys have advantages such as low resistivity, stability, and a wide range of melting points, are superior to tin-lead alloys in mechanical properties such as tensile strength, thermal fatigue, and creep, and have particularly excellent joint strength.

The tin-silver plating solution of the present invention is for manufacturing a solder bump containing the above-described tin-silver alloy, and contains a source of tin ions and a source of silver ions ($Ag^+$).

In an embodiment of the present invention, the source of tin ions is a substance that supplies tin ions ($Sn^{2+}$) to the tin-silver plating solution of the present invention, and may be a water-soluble tin compound, and the water-soluble tin compound may be, for example, one or more selected from the group consisting of tin sulfate, tin hydrochloride, tin sulfamate, tin acetate, tin phosphate, tin methanesulfonate, tin gluconate, and tin carboxylate, for example, tin methanesulfonate exhibiting high solubility.

In an embodiment of the present invention, the source of silver ions ($Ag^+$) is a substance that supplies silver ions ($Ag^+$) to the tin-silver plating solution of the present invention, and may be a water-soluble silver compound, and the water-soluble silver (Ag) compound may include, for example, one or more selected from the group consisting of silver sulfate, silver hydrochloride, silver sulfamate, silver acetate, silver phosphate, silver methanesulfonate, silver gluconate, and silver carboxylate, for example, silver methanesulfonate.

In an embodiment of the present invention, tin ions and silver ions ($Ag^+$) in the tin-silver plating solution may be provided at a weight ratio of 75:25 to 99.9:0.1, and the source of tin ions and the source of silver ions ($Ag^+$) may be provided so that the tin ions and the silver ions ($Ag^+$) can be provided at the weight ratio.

In a case where tin-silver solder bumps are formed using a tin-silver plating solution having a weight ratio of tin ions to silver ions ($Ag^+$) within the aforementioned range, solderability may be favorable. On the other hand, in a case where the weight ratio of tin ions to silver ions ($Ag^+$) is out of the above range, for example, problems such as the probability of whisker generation in the plating process and an increase in melting temperature in the reflow process may occur when tin-silver solder bumps are formed.

Next, the tin-silver plating solution of the present invention contains an organic additive.

The organic additive is added to diminish whisker generation in tin-silver solder bumps manufactured using the tin-silver plating solution of the present invention and to improve non-uniformity of silver (Ag) composition, and contains a silver (Ag) complexing agent, a tin carrier, and a crystal grain refiner.

In an embodiment of the present invention, the silver (Ag) complexing agent included in the organic additive may be a compound represented by the following Chemical Formula 1:

[Chem. 1]

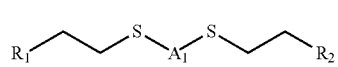

Here, $A_1$ is a linear alkylene having 1 to 10 carbon atoms and $R_1$ and $R_2$ are each a functional group containing any one or more of carbon, oxygen, nitrogen, sulfur, or silicon.

The tin-silver plating solution may form a whisker structure, which may deteriorate the characteristics of solder bumps depending on the change in silver (Ag) composition, or $Ag_3Sn$ phase with a high melting point, so precise control of the silver (Ag) composition is thus required.

The control of the silver (Ag) composition is difficult since the difference in reduction potential between tin ions and silver ions ($Ag^+$) is significantly large, silver precipitation occurs when the plating solution is used for a long time and shortens the life of the plating solution.

The reduction potentials of silver ions ($Ag^+$) and tin ions ($Sn^{2+}$) are as shown in the following Reaction Formula 1:

$$Ag^+ + e \rightarrow Ag \quad E_0 = +0.8 \text{ V}$$

$$Sn^{2+} + 2e \rightarrow Sn \quad E_0 = -0.14 \text{ V}$$

[Reaction Formula 1]

In an embodiment of the present invention, in a case where silver ions ($Ag^+$) are exposed to tin ions or under-bump-metallurgy (UBM) during plating using a tin-silver plating solution, silver ions ($Ag^+$) may spontaneously oxidize tin ions or the under-bump-metallurgy and at the same time may be reduced to silver (Ag) to be precipitated.

The precipitated silver (Ag) may become finely separated silver (Ag) metal floating in the plating solution or may be spontaneously deposited on the substrate, the wall surface of the plating bath, and the electrode, and this may make it difficult to control the concentration of silver ions ($Ag^+$) in the plating solution.

Hence, it is required to improve stability by preventing precipitation of silver (Ag) during plating using a tin-silver plating solution, and minimize the error range of the silver composition in tin-silver solder by decreasing the difference in reduction potential between tin ions and silver ions ($Ag^+$). The silver (Ag) complexing agent may serve to improve stability by preventing precipitation of silver and minimize the error range of the silver composition in tin-silver solder by decreasing the difference in reduction potential between tin ions and silver ions ($Ag^+$).

In an embodiment of the present invention, the source of silver ions ($Ag^+$) and the silver (Ag) complexing agent may be provided at a molar ratio of 1:1 to 1:10.

In an embodiment of the present invention, $R_1$ may be any one of an aldehyde group, a hydroxyl group, a methyl group, a carboxyl group, a mercapto group, an amine group, a thiol group, a nitrile group, or a pyridyl group, for example, pyridyl, $R_2$ may be any one of an aldehyde group, a hydroxyl group, a methyl group, a carboxyl group, a mercapto group, an amine group, a thiol group, a nitrile group, or a pyridyl group, for example, pyridyl, and the compound represented by Chemical Formula 1 may be 3,6-dithia-1,8-octanediol.

In an embodiment of the present invention, the tin carrier included in the organic additive may be a compound represented by the following Chemical Formula 2:

In an embodiment of the present invention, the crystal grain refiner included in the organic additive may be a compound represented by the following Chemical Formula 3:

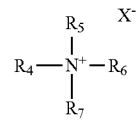

[Chem. 3]

Here, $R_4$ is hydrogen, a linear alkyl having 1 to 20 carbon atoms, a branched alkyl having 5 to 20 carbon atoms, or a linear alkyl having 1 to 7 carbon atoms including a hydroxyl group; $R_5$ is hydrogen, a linear alkyl having 1 to 20 carbon atoms, a branched alkyl having 5 to 20 carbon atoms, or a linear alkyl having 1 to 7 carbon atoms including a hydroxyl group; $R_6$ is hydrogen, a linear alkyl having 1 to 20 carbon atoms, or a branched alkyl having 5 to 20 carbon atoms; $R_7$ is hydrogen, a linear alkyl having 1 to 20 carbon atoms, or a branched alkyl having 5 to 20 carbon atoms; and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

In an embodiment of the present invention, in the case of performing tin-silver plating on the under-bump-metallurgy, for example, copper, an intermetallic compound (IMC) may be produced and thus whiskers may be generated by stress due to thermal expansion in the heating process after tin plating. Specifically, direct mechanical stress such as formation of intermetallic compound, tension, and compression, thermomechanical stress due to difference in coefficient of thermal expansion, and stress due to surface oxidation and the like may be generated, and this may lead to growth of whiskers.

In an embodiment of the present invention, the crystal grain refiner included in the organic additive may suppress whisker growth by decreasing internal stress in the tin plating layer through suppression of the growth of intermetallic compound of copper and tin.

In an embodiment of the present invention, $R_4$ may be a linear alkyl having two carbon atoms including a hydroxyl

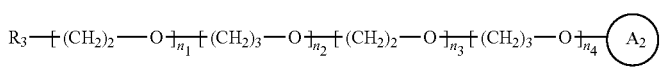

[Chem. 2]

Here, $A_2$ is a substituted or unsubstituted $C_6$ to $C_{30}$ aryl group or a heteroaryl having 6 to 30 ring atoms including a hetero atom in which one or more ring carbon atoms are each composed of any one or more of nitrogen, oxygen, or sulfur; $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation; and $n_1$ to $n_4$ are each an integer of 0 to 26, provided that the sum of $n_1$ to $n_4$ is 10 to 26.

group, $R_5$ may be a linear alkyl having two carbon atoms including a hydroxyl group, $R_6$ may be a linear alkyl having 12 carbon atoms, $R_7$ may contain hydrogen singly, and X may be a halogen ion, and the crystal grain refiner may be, for example, bis(2-hydroxyethyl)-methyl-tridecylazanium.

The tin-silver plating solution of the present invention may further contain any one or more of a conductive salt, an antioxidant, or a smoothing agent.

In an embodiment of the present invention, the conductive salt serves to maintain the pH of the tin-silver plating solution and impart electrical conductivity, and at least one selected from the group consisting of a hydroxycarboxylic acid and an alkanesulfonic acid may be used, but the conductive salt is not limited thereto, and may be, for example, at least one selected from the group consisting of methanesulfonic acid, ethanesulfonic acid, and propanesulfonic acid, for example, methanesulfonic acid.

The conductive salt may be contained at 5 wt % to 30 wt % based on 100 wt % of the tin-silver plating solution.

Electrical conductivity may not be sufficiently imparted to the plating solution and the plating speed may decrease when the conductive salt is contained at less than 5 wt %, and it may be difficult to control the plating shape when the conductive salt is contained at more than 30 wt %.

In an embodiment of the present invention, the antioxidant is to minimize or prevent oxidation of divalent tin ion ($Sn^{2+}$) to tetravalent tin ion ($Sn^{4+}$) and maintain divalent tin ion ($Sn^{2+}$), and one or two or more selected from polyhydroxy aromatic compounds may be used, but the antioxidant is not limited thereto, and may be, for example, at least one selected from the group consisting of catecol, hydroquinone, resorcinol, cresol, phloroglucinol, oxy hydroquinone, and pyrogallol.

The content of the antioxidant may be 0.01 g/L to 20 g/L. Tin ions ($Sn^{4+}$) in the plating solution increase to shorten the life of the plating solution when the content of the antioxidant is less than 0.01 g/L, and the uniformity and smoothness of solder may deteriorate when the content of the antioxidant exceeds 20 g/L.

In an embodiment of the present invention, the smoothing agent serves to improve the ability of the liquid to wet into fine patterns or narrow spaces and broaden the operation range by improving the wettability of the solution during plating, and one or more selected from the group consisting of a nonionic surface active agent, a cationic surface active agent, an anionic surface active agent, and a synthetic polymer may be used, but the smoothing agent is not limited thereto, and may be, for example, a nonionic surfactant, for example, any one of 2-naphthyl ethyl ether, polyoxyalkylene ether, polyoxyethylene glycol, polyoxyethylene alkylphenyl ether, or polyoxyethylene alkyl amino ether.

An aspect of the present invention provides a method of forming a tin-silver solder bump.

FIG. 1 is a flowchart of a method of forming a tin-silver solder bump according to the present invention;

Referring to FIG. 1, the method of forming a tin-silver solder bump according to the present invention is a method of forming a tin-silver solder bump, including: a step S10 of exposing an under-bump-metallurgy structure to a plating bath containing a tin-silver plating solution that contains a source of tin ions; a source of silver ions ($Ag^+$); and an organic additive, the organic additive including a silver (Ag) complexing agent represented by the following Chemical Formula 1, a tin carrier represented by the following Chemical Formula 2, and a crystal grain refiner represented by the following Chemical Formula 3; and a step S20 of plating a tin-silver alloy on the under-bump-metallurgy structure by applying a current:

[Chem. 1]

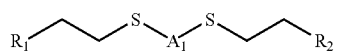

Here, $A_1$ is a linear alkylene having 1 to 10 carbon atoms and $R_1$ and $R_2$ are each a functional group containing any one or more of carbon, oxygen, nitrogen, sulfur, or silicon.

Here, $A_2$ is a substituted or unsubstituted $C_6$ to $C_{30}$ aryl group or a heteroaryl group having 6 to 30 ring atoms including a hetero atom in which one or more ring carbon atoms are each composed of any one or more of nitrogen, oxygen, or sulfur, $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation, and $n_1$ to $n_4$ are each an integer of 0 to 26, provided that a sum of $n_1$ to $n_4$ is 10 to 26.

[Chem. 3]

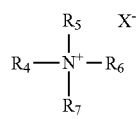

Here, $R_4$ is hydrogen, a linear alkyl having 1 to 20 carbon atoms, a branched alkyl having 5 to 20 carbon atoms, or a linear alkyl having 1 to 7 carbon atoms including a hydroxyl group; $R_5$ is hydrogen, a linear alkyl having 1 to 20 carbon atoms, a branched alkyl having 5 to 20 carbon atoms, or a linear alkyl having 1 to 7 carbon atoms including a hydroxyl group; $R_6$ is hydrogen, a linear alkyl having 1 to 20 carbon atoms, or a branched alkyl having 5 to 20 carbon atoms; $R_7$ is hydrogen, a linear alkyl having 1 to 20 carbon atoms, or a branched alkyl having 5 to 20 carbon atoms; and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

The method of forming a tin-silver solder bump according to the present invention includes a step S10 of exposing an under-bump-metallurgy structure to a plating bath containing a tin-silver plating solution.

In an embodiment of the present invention, the tin-silver plating solution may be the tin-silver plating solution of the above aspect, and the source of tin ions, source of silver ions ($Ag^+$), and organic additive may be the source of tin ions, source of silver ions ($Ag^+$), and organic additive of the above aspect.

Descriptions of the source of tin ions, source of silver ions ($Ag^+$), and organic additive are replaced with the description thereof in the above aspect.

The method of forming a tin-silver solder bump according to the present invention includes a step S20 of plating a tin-silver alloy on the under-bump-metallurgy structure by applying a current.

In an embodiment of the present invention, the step S20 of plating a tin-silver alloy may be performed by an elec-

[Chem. 2]

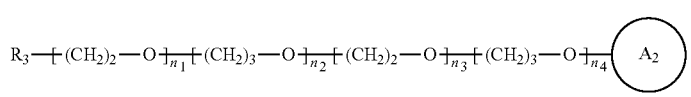

troplating method, for example, in an electroplating bath containing the tin-silver plating solution.

The method of forming a tin-silver solder bump of the present invention can be used without limitation as long as it is a method of forming a solder by an electroplating method in the technical field of the present invention, and may be used to manufacture a microelectronic device using this.

For example, the method may be started by forming an under-bump-metallurgy structure on a patterned silicon wafer substrate capable of manufacturing a microelectronic device, and exposing the under-bump-metallurgy structure by immersing the silicon wafer substrate on which the under-bump-metallurgy structure is formed in an electroplating bath containing the tin-silver plating solution.

At this time, the under-bump-metallurgy structure may be one in which titanium (Ti) and copper (Cu), titanium and nickel (Ni), chromium (Cr) and copper, chromium and nickel, titanium tungstate (TiW) and copper, or titanium tungstate and nickel is sequentially formed on a silicon wafer substrate to a predetermined thickness, but is not limited thereto, and may be, for example, one in which copper is formed on the silicon wafer substrate.

In an embodiment of the present invention, the current applied in the step of plating a tin-silver alloy may be 1 ASD (Amp/dm$^2$) to 20 ASD (Amp/dm$^2$), for example, 1 ASD to 10 ASD.

The method of forming a tin-silver solder bump of the present invention can perform high-speed plating at a high current density and can thus achieve high throughput.

Tin-silver solder bumps formed using the method of forming a tin-silver solder bump of the present invention can have a uniform bump height, improved surface roughness and solderability, and uniform content and distribution of silver (Ag) in the bumps, cause diminished whisker generation, and exhibit favorable reflow characteristics. Moreover, there is an effect of maintaining excellent processability and reliability of ultra-fine bumps.

EXAMPLES

Hereinafter, the present invention will be described in more detail through Preparation Examples, Comparative Examples, and Experimental Examples. However, the present invention is not limited to the following Preparation Examples, Comparative Examples, and Experimental Examples.

Preparation Example 1

In this Preparation Example 1, an under-bump-metallurgy structure was formed, and electroplating was performed on a silicon wafer having a pattern using a copper plating solution to a thickness of 10 μm.

At this time, the copper plating solution was prepared by mixing 50 g of copper ions, 150 g of sulfate ions, 50 mg of chlorine ions, a polyethylene oxide derivative containing an aromatic hydrocarbon as an inhibitor, an organic compound containing a mercapto group as an accelerator, and a saturated heterocyclic compound containing nitrogen as a smoothing agent per 1 L of plating solution, and the electroplating was performed by applying a current at a current density of 5 ASD for 10 minutes.

Example 1

In this Example 1, a tin-silver plating solution containing a crystal grain refiner was prepared.

Specifically, tin methanesulfonate and silver methanesulfonate were mixed to prepare a plating solution containing 50.0 g/L of tin ions ($Sn^{2+}$), 0.5 g/L of silver ions ($Ag^+$), and 120 g/L of methanesulfonate ions, and 2 g/L of a silver complexing agent represented by the following Chemical Formula 1, 20 g/L of a tin carrier represented by the following Chemical Formula 2, 1 g/L of catechol as an antioxidant, and 10 g/L of a crystal grain refiner represented by the following Chemical Formula 3 were added to the plating solution as organic additives, thereby preparing a tin-silver plating solution.

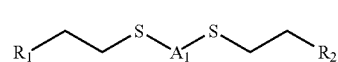

[Chem. 1]

Here, $A_1$ is ethylene, and $R_1$ and $R_2$ are each pyridyl.

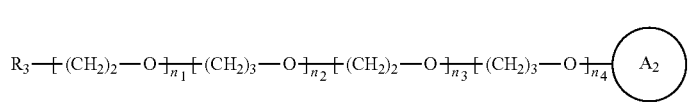

[Chem. 2]

Here, $A_2$ is a phenyl group, $R_3$ is a hydroxyl group, each of $n_1$ to $n_3$ is 0, $n_4$ is 12, and the sum is 12.

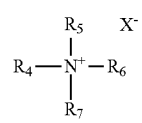

[Chem. 3]

Here, the $R_4$ is a linear alkyl having two carbon atoms including a hydroxyl group at the terminal group, $R_5$ is a linear alkyl having two carbon atoms including a hydroxyl group at the terminal group, $R_6$ is a linear alkyl having 12 carbon atoms, $R_7$ is a linear alkyl having 1 carbon atom, and X is chlorine (Cl).

Comparative Example 1

In this Comparative Example 1, a tin-silver plating solution not containing a crystal grain refiner was prepared.

As a specific preparation method, a tin-silver plating solution was prepared in the same manner as in Example 1 except that the crystal grain refiner was not added in Example 1.

Experimental Example 1

In this Experimental Example 1, tin-silver plating was performed using the tin-silver plating solutions prepared in Example 1 and Comparative Example 1, and the performance of the plating solutions during plating was tested.

The silicon wafer on which an under-bump-metallurgy structure of Preparation Example 1 was formed was immersed in the tin-silver plating solutions prepared in Example 1 and Comparative Example 1, respectively, and a current was applied in a current density range of 1 ASD to 10 ASD to perform tin-silver plating.

Figure 2:
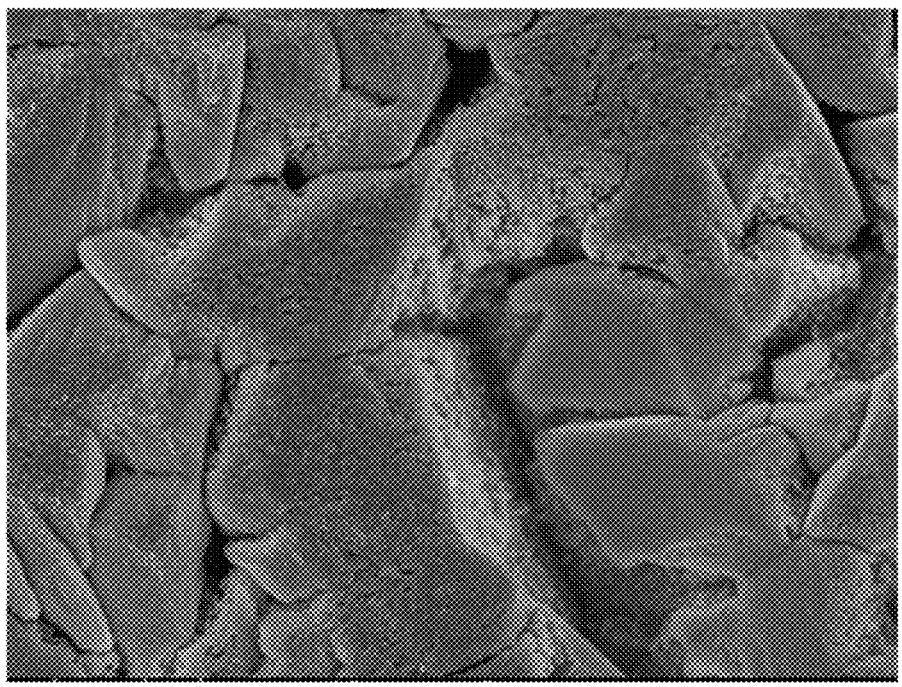
FIG. 2 is scanning electron microscope images of the surface of tin-silver solder bumps in Example of the present invention and Comparative Example.
Figure 2:
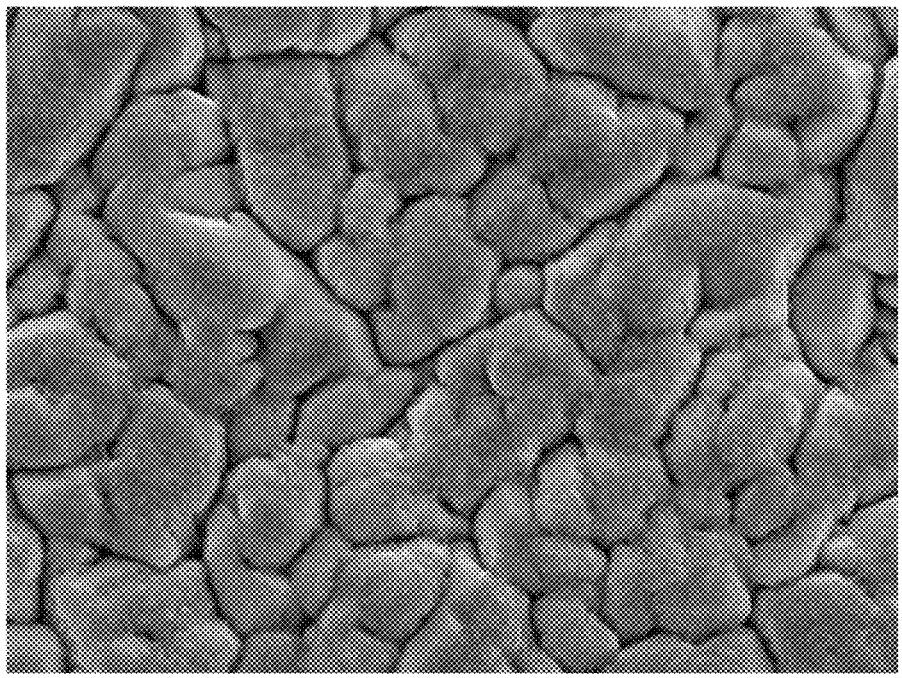

Scanning electron microscope (SEM) images of the surface of tin-silver solder bumps formed using the tin-silver plating solutions of Comparative Example 1 and Example 1 are illustrated in FIG. 2.

Figure 3:
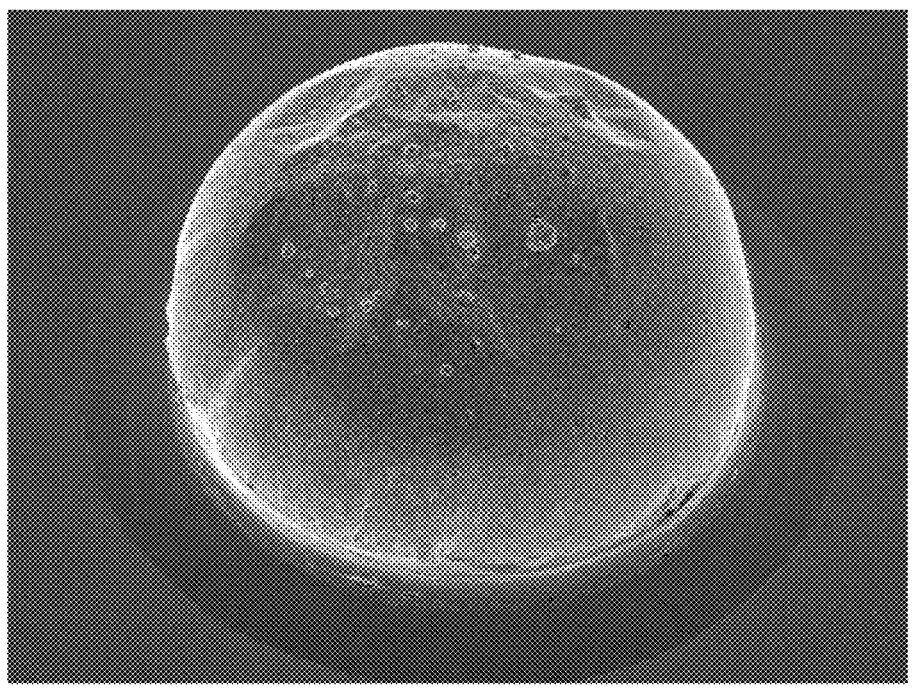
FIG. 3 is scanning electron microscope images of soldering products in Example of the present invention and Comparative Example.
Figure 3:
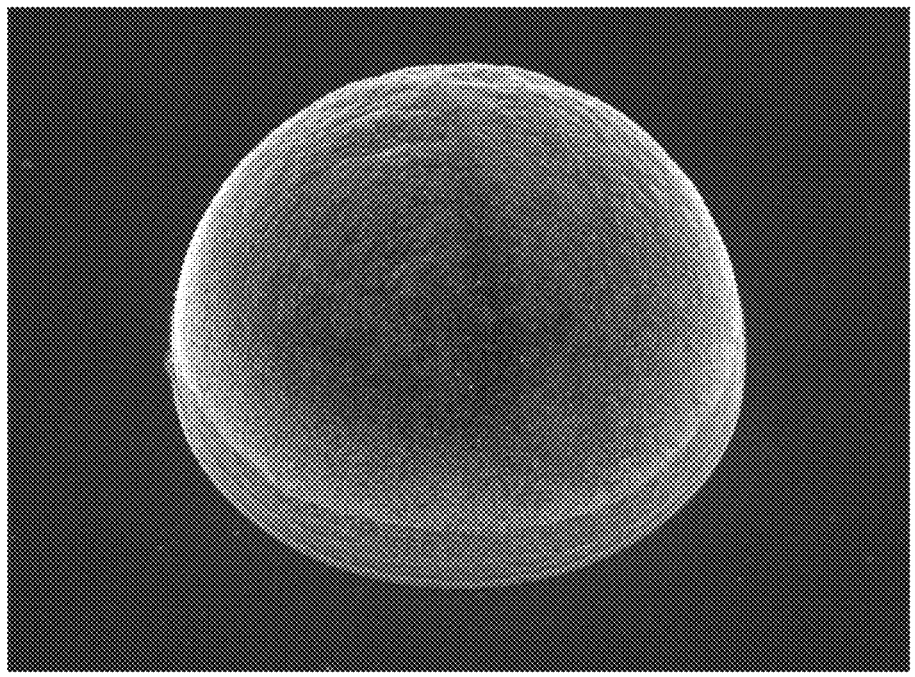

A reflow process was performed on the tin-silver solder bumps formed using the tin-silver plating solutions of Comparative Example 1 and Example 1, scanning electron microscope (SEM) images of the formed soldering products are illustrated in FIG. 3, and the surface roughness and silver content are shown in the following Table 1:

TABLE 1

|  | Surface roughness (nm) | Silver content (wt %) |
| --- | --- | --- |
| Comparative Example 1 | 168.05 | 1.99 |
| Example 1 | 89.71 | 2.07 |

Referring to FIGS. 2 and 3 and Table 1, it has been confirmed that the pattern surface roughness and solderability in Example 1 are improved compared to those in Comparative Example 1.

Example 2

In this Example 2, tin-silver plating solutions were prepared using various silver complexing agents.

In this Example 2, preparation was performed by changing only the silver complexing agent in Example 1 to different silver complexing agents. In this case, as will be described later, the silver complexing agents differ from the silver complexing agent in Example 1 only in $A_1$, $R_1$, and $R_2$ in Chemical Formula 1.

$A_1$, $R_1$, and $R_2$ are as shown in the following Table 2.

[Chem. 1]

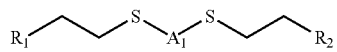

TABLE 2

| entry | A1 | R1 | R2 |
| --- | --- | --- | --- |
| Example 2a | Methylene | Carboxyl group | Carboxyl group |
| Example 2b | Methylene | Diethylamine | Diethylamine |

Example 3

In this Example 3, tin-silver plating solutions were prepared using various tin carriers.

In this Example 3, preparation was performed by changing only the tin carrier in Example 1 to different tin carriers. In this case, as will be described later, the tin carriers differ from the tin carrier in Example 1 only in $A_2$, $R_3$, and $n_1$ to $n_4$ in Chemical Formula 2.

$A_2$, $R_3$, and $n_1$ to $n_4$ are as shown in the following Table 3.

[Chem. 2]

$$R_3 \!\!-\!\!\left[(CH_2)_2\!-\!O\right]_{n_1}\!\!\left[(CH_2)_3\!-\!O\right]_{n_2}\!\!\left[(CH_2)_2\!-\!O\right]_{n_3}\!\!\left[(CH_2)_3\!-\!O\right]_{n_4}\!\!A_2$$

TABLE 3

| entry | A2 | R3 | n1 | n2 | n3 | n4 |
| --- | --- | --- | --- | --- | --- | --- |
| Example 3a | Naphthol | Sodium sulfonate | 0 | 0 | 0 | 12 |
| Example 3b | Nonylphenol | Hydroxyl group | 0 | 0 | 0 | 15 |

Example 4

In this Example 4, tin-silver plating solutions were prepared using various crystal grain refiners.

In this Example 4, preparation was performed by changing only the crystal grain refiner in Example 1 to different crystal grain refiners. In this case, as will be described later, the crystal grain refiners differ from the crystal grain refiner in Example 1 only in $R_4$, $R_5$, $R_6$, $R_7$ and X in Chemical Formula 3, and $R_4$, $R_5$, $R_6$, $R_7$ and X are as shown in the following Table 4.

[Chem. 3]

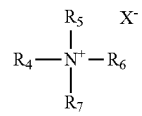

TABLE 4

| entry | R4 | R5 | R6 | R7 | X |
| --- | --- | --- | --- | --- | --- |
| Example 4a | Linear alkyl having 4 carbon atoms | Linear alkyl having 4 carbon atoms | Linear alkyl having 4 carbon atoms | Linear alkyl having 4 carbon atoms | Hydroxyl group |
| Example 4b | 3 carbon atoms including hydroxyl group at terminal group | 3 carbon atoms including hydroxyl group at terminal group | Linear alkyl having 2 carbon atoms | Linear alkyl having 18 carbon atoms | Bromine |

TABLE 4-continued

| entry | R4 | R5 | R6 | R7 | X |
|---|---|---|---|---|---|
| Example 4c | Linear alkyl having 4 carbon atoms | Linear alkyl having 4 carbon atoms | Linear alkyl having 4 carbon atoms | Linear alkyl having 14 carbon atoms | Chlorine |

Experimental Example 2

In this Experimental Example 2, an experiment was conducted to perform plating using various tin-silver plating solutions prepared in Examples 2 to 4.

The specific experiment in this Experimental Example 2 was conducted in the same manner as the experiment in Experimental Example 1 by changing only the used tin-silver plating solution to the tin-silver plating solutions of Examples 2 to 4.

The silicon wafer on which an under-bump-metallurgy structure of Preparation Example 1 was formed was immersed in the tin-silver plating solutions prepared in Examples 2 to 4, respectively, and a current was applied in a current density range of 1 ASD to 10 ASD to perform tin-silver plating.

A reflow process was performed on the tin-silver solder bumps formed using the tin-silver plating solutions of Examples 2 to 4, scanning electron microscope (SEM) images of the formed soldering products are illustrated respectively, and the surface roughness and silver content are shown in the following Table 5:

TABLE 5

Figure 4:
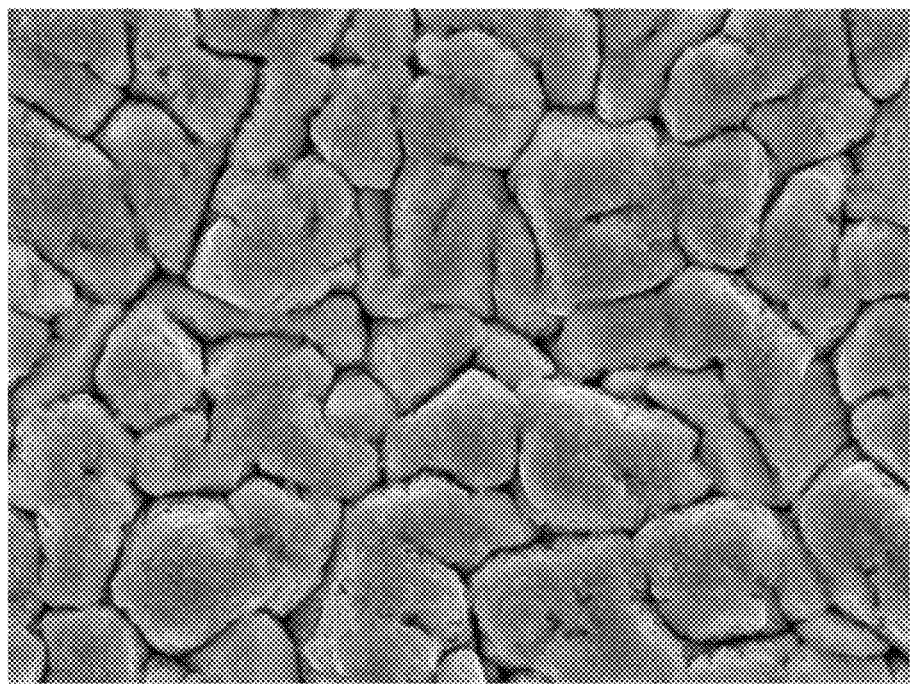
FIG. 4 is scanning electron microscope images of the surface of a tin-silver solder bump and a soldering product in Example 2a of the present invention.
Figure 4:
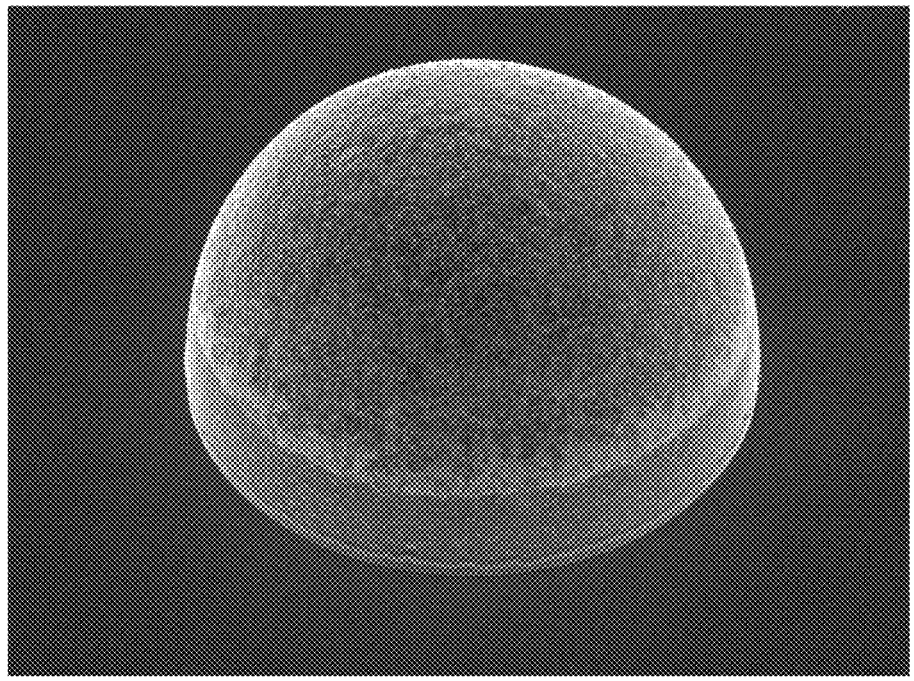
Figure 5:
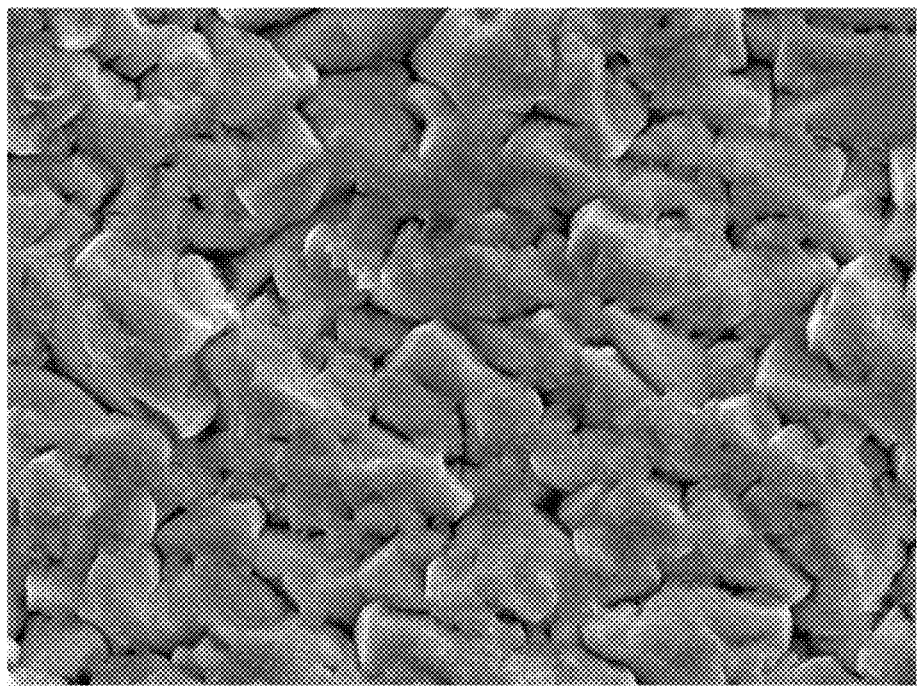
FIG. 5 is scanning electron microscope images of the surface of a tin-silver solder bump and a soldering product in Example 2b of the present invention.
Figure 5:
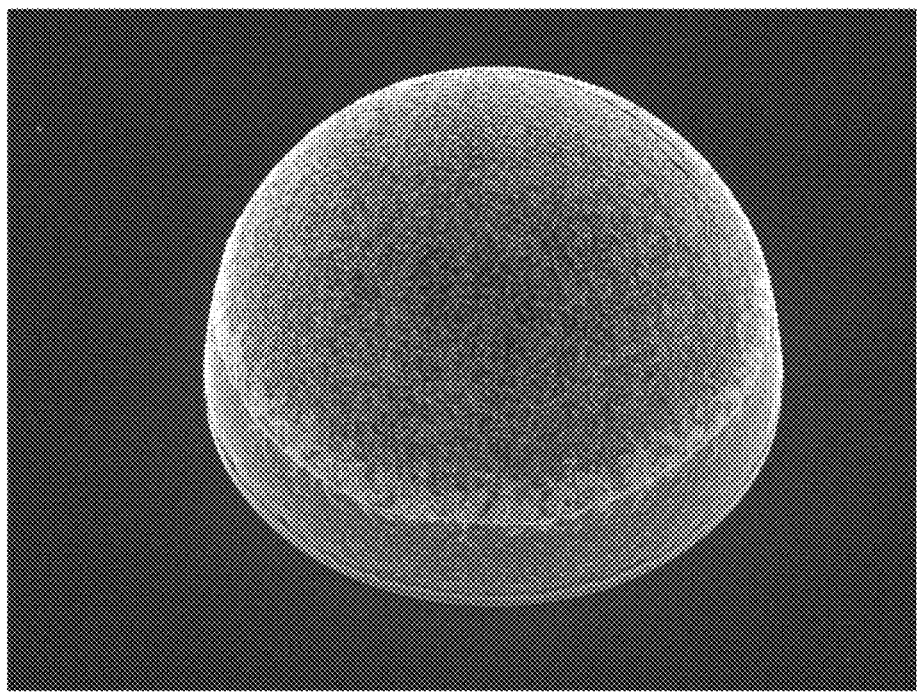
Figure 6:
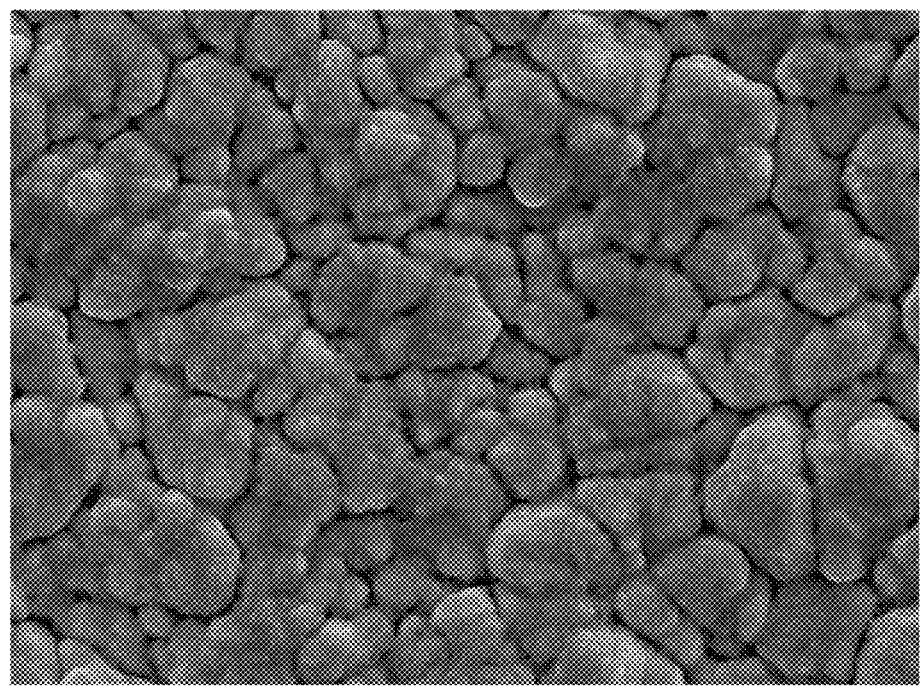
FIG. 6 is scanning electron microscope images of the surface of a tin-silver solder bump and a soldering product in Example 3a of the present invention.
Figure 6:
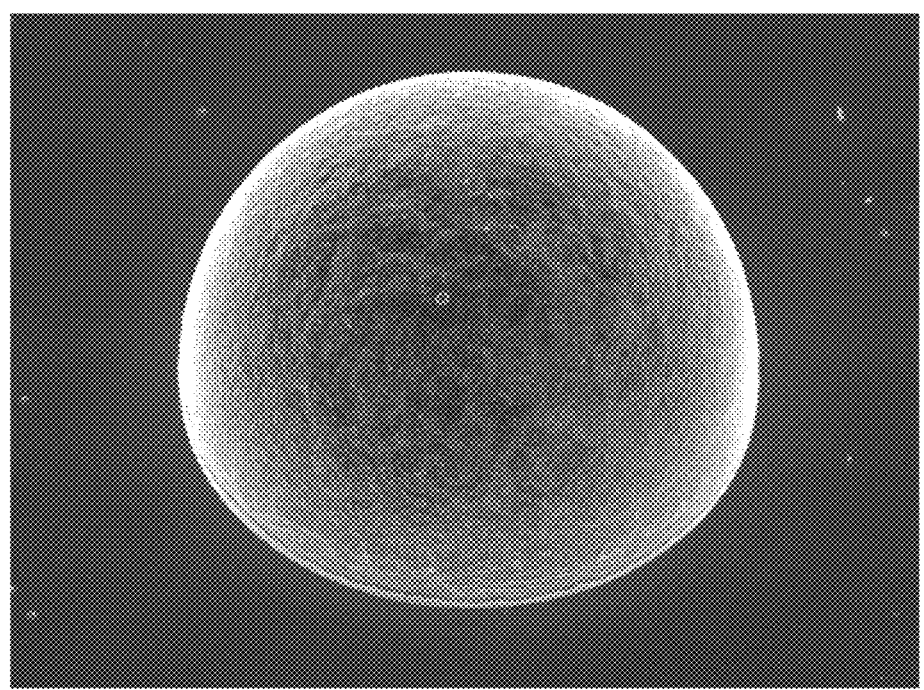
Figure 7:
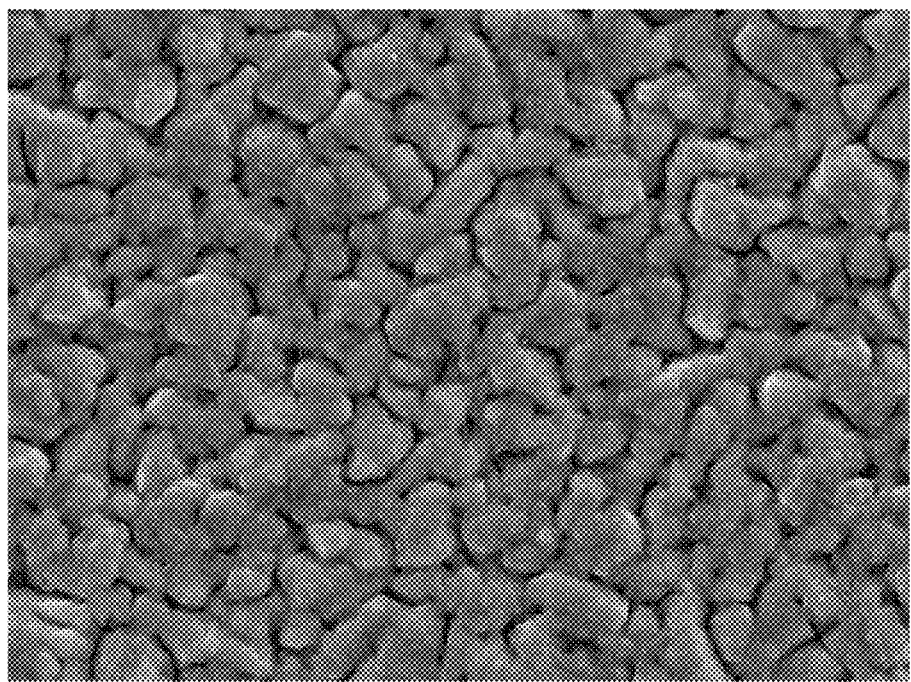
FIG. 7 is scanning electron microscope images of the surface of a tin-silver solder bump and a soldering product in Example 3b of the present invention.
Figure 7:
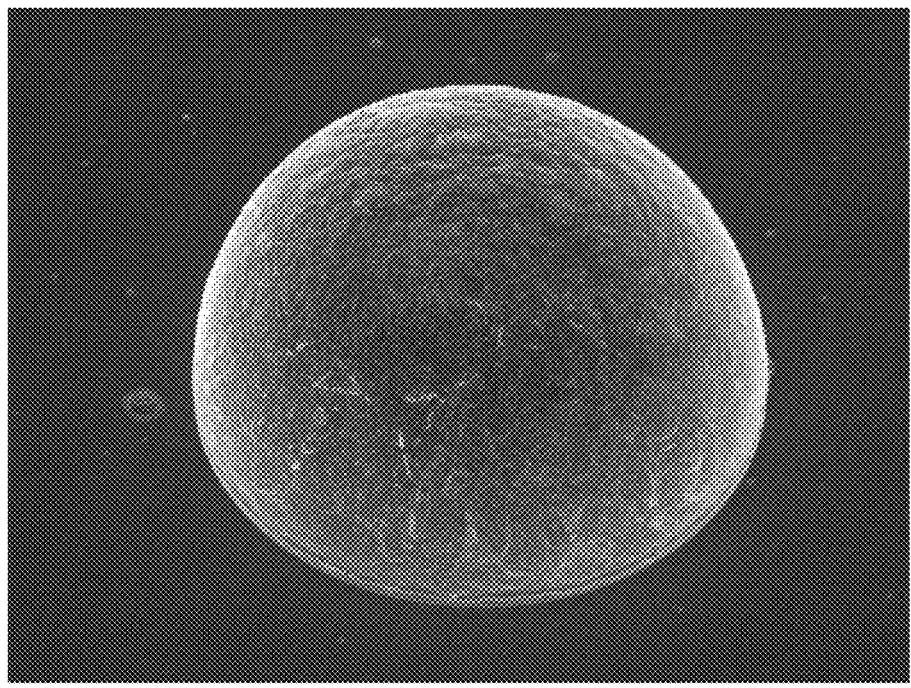
Figure 8:
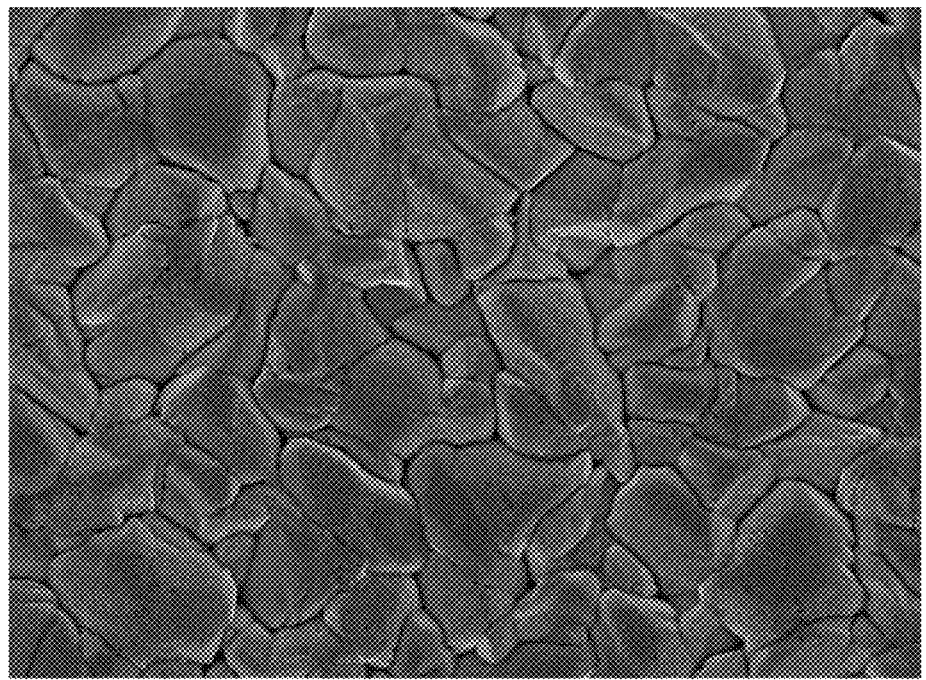
FIG. 8 is scanning electron microscope images of the surface of a tin-silver solder bump and a soldering product in Example 4a of the present invention.
Figure 8:
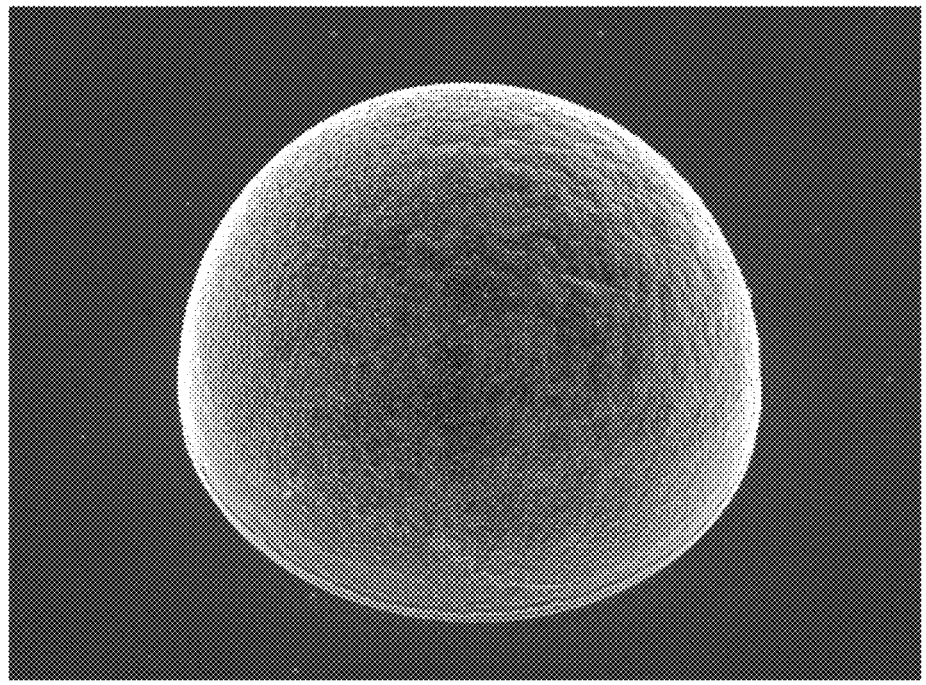
Figure 9:
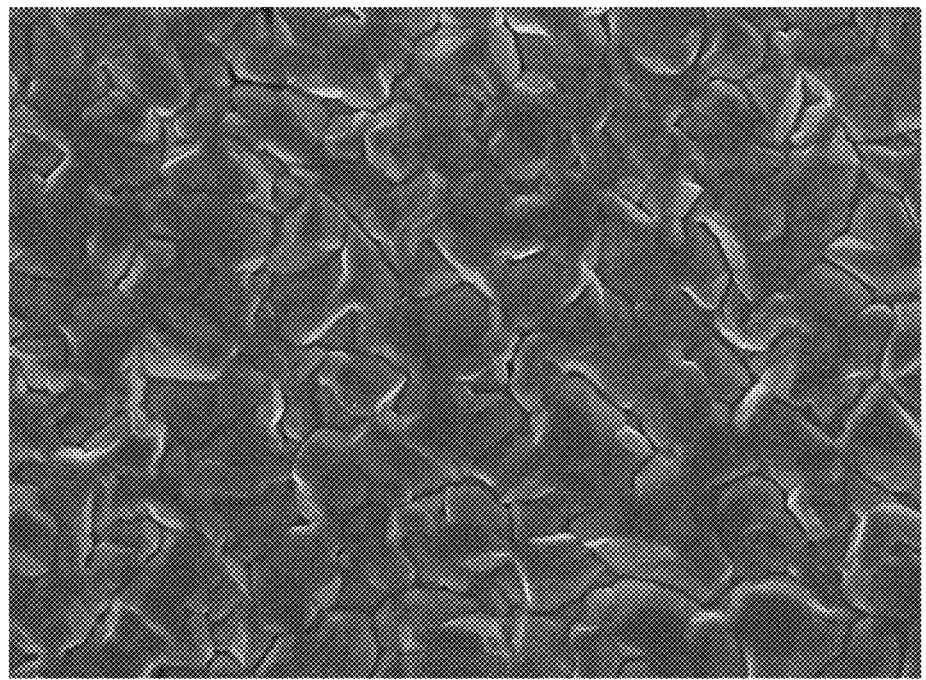
FIG. 9 is scanning electron microscope images of the surface of a tin-silver solder bump and a soldering product in Example 4b of the present invention.
Figure 9:
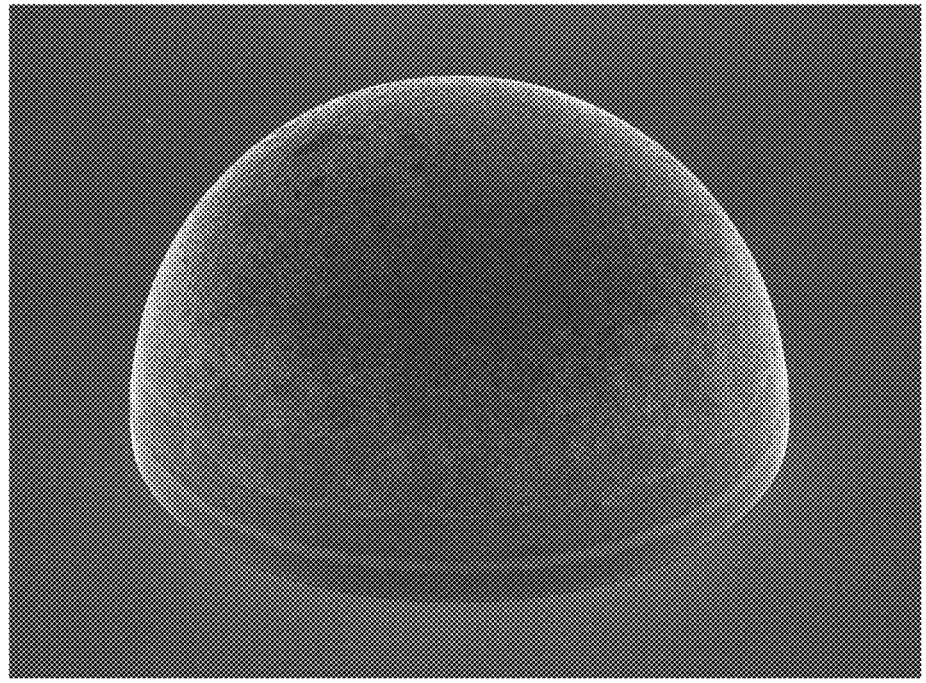
Figure 10:
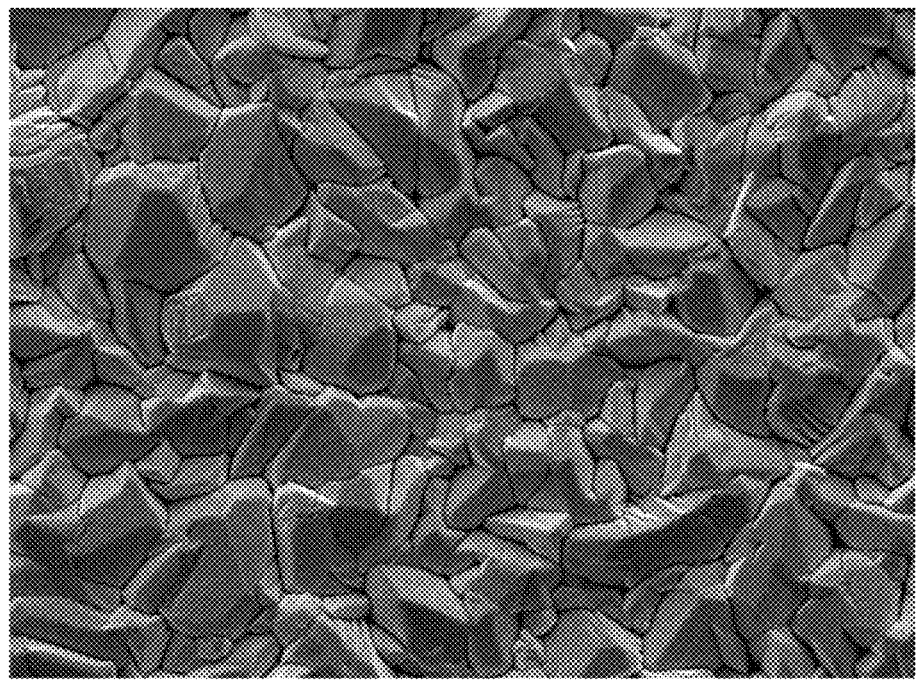
FIG. 10 is scanning electron microscope images of the surface of a tin-silver solder bump and a soldering product in Example 4c of the present invention.
Figure 10:
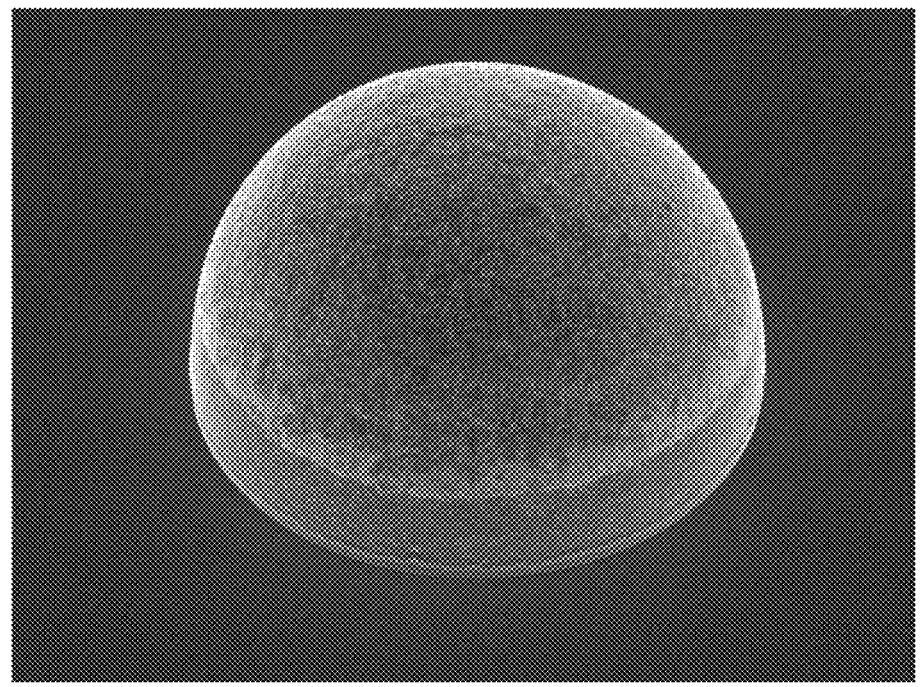

|  | Drawing | Surface roughness (nm) | Silver content (wt %) |
|---|---|---|---|
| Example 2a | FIG. 4 | 86.21 | 1.99 |
| Example 2b | FIG. 5 | 73.16 | 2.07 |
| Example 3a | FIG. 6 | 65.22 | 2.23 |
| Example 3b | FIG. 7 | 55.38 | 1.95 |
| Example 4a | FIG. 8 | 78.59 | 2.11 |
| Example 4b | FIG. 9 | 49.36 | 1.86 |
| Example 4c | FIG. 10 | 68.18 | 2.03 |

As a result of the experiment, it has been found that excellent pattern surface roughness and solderability are acquired by variously controlling the silver complexing agent, tin carrier, and crystal grain refiner.

Experimental Example 3

In this Experimental Example 3, an experiment was conducted to confirm the effect depending on the weight ratio by changing the weight ratio of tin ions to silver ions in the tin-silver plating solution.

The silver content and the solution state depending on the specific weight ratio of tin ions to silver ions are as shown in the following Table 6.

When the weight ratio is higher than 99.9:0.1, the amount of silver ions is extremely small, thus the amount of silver ions incorporated into the plating film is insignificant, and the silver content converges to 0. When the weight ratio is lower than 75:25, excessive silver ions react with tin ions to generate precipitates.

[Table 6]

| Tin ion (g/l) | Silver ion (g/l) | Weight ratio | Silver content (wt %) | Solution state |
|---|---|---|---|---|
| 50 g/l | 0.01 g/l | 99.98:0.02 | 0 | Normal |
| 50 g/l | 0.5 g/l | 99.00:1.00 | 2.07 | Normal |
| 50 g/l | 1.0 g/l | 98.04:1.96 | 4.27 | Normal |
| 70 g/l | 30 g/l | 70.00:30.00 | — | Precipitate generated |

Experimental Example 4

In this Experimental Example 4, an experiment was conducted to confirm the effect depending on the molar ratio by changing the molar ratio of silver (Ag) complexing agent to silver ions.

The silver content and the solution state depending on the molar ratio of silver ions to silver complexing agent are as shown in the following Table 7.

When the molar ratio is lower than 1:1, silver ions cannot be sufficiently complexed to generate precipitates.

On the other hand, when the molar ratio is higher than 1:1, silver ions are sufficiently complexed, so the solution is in a stable state and the silver content can be uniformly maintained.

[Table 7]

| Silver ion (mM) | Silver complexing agent (mM) | Molar ratio | Silver content (wt %) | Solution state |
|---|---|---|---|---|
| 4.63 | 1.85 | 1:0.40 | — | Precipitate generated |
| 4.63 | 6.57 | 1:1.42 | 2.07 | Normal |
| 4.63 | 41.67 | 1:8.00 | 1.86 | Normal |
| 9.26 | 46.30 | 1:5.00 | 1.72 | Normal |

The foregoing description of the present invention is for illustrative purposes only, and those skilled in the art to which the present invention pertains will understand that the present invention can be easily modified into other specific forms without changing the technical spirit or essential features thereof. Therefore, the embodiments described above should be understood as illustrative in all respects and not limiting. For example, each component described as a single type may be implemented in a distributed manner, and similarly, components described as distributed may be implemented in a combined form.

The scope of the present invention is indicated by the following claims, and all changes or modifications derived from the meaning and scope of the claims and their equivalent concepts should be construed as being included in the scope of the present invention.

The invention claimed is:

1. A tin-silver plating solution comprising: a source of tin ions; a source of silver ions ($Ag^+$); and an organic additive, wherein the organic additive includes a silver (Ag) complexing agent represented by the following Chemical Formula 1, a tin carrier represented by the following Chemical Formula 2, and a crystal grain refiner represented by the following Chemical Formula 3:

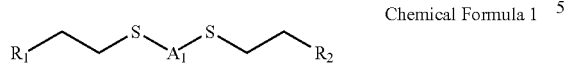

Chemical Formula 1 where $A_1$ is a linear alkylene having 1 to 10 carbon atoms and $R_1$ and $R_2$ are each independently a functional group containing any one or more of carbon, oxygen, nitrogen, sulfur, or silicon;

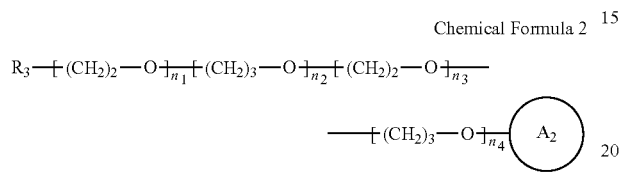

Chemical Formula 2 where $A_2$ is an unsubstituted $C_6$ to $C_{30}$ aryl group or a heteroaryl group having 6 to 30 ring atoms including a hetero atom in which one or more ring carbon atoms are each composed of any one or more of nitrogen, oxygen, or sulfur, $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation, and $n_1$ to $n_4$ are each independently an integer of 0 to 26, provided that a sum of $n_1$ to $n_4$ is 10 to 26; and

Chemical Formula 3 where $R_4$ is hydrogen, a linear alkyl having 1 to 20 carbon atoms, a branched alkyl having 5 to 20 carbon atoms, or a linear alkyl having 1 to 7 carbon atoms including a hydroxyl group, $R_5$ is hydrogen, a linear alkyl having 1 to 20 carbon atoms, a branched alkyl having 5 to 20 carbon atoms, or a linear alkyl having 1 to 7 carbon atoms including a hydroxyl group, $R_6$ is hydrogen, a linear alkyl having 1 to 20 carbon atoms, or a branched alkyl having 5 to 20 carbon atoms, $R_7$ is hydrogen, a linear alkyl having 1 to 20 carbon atoms, or a branched alkyl having 5 to 20 carbon atoms, and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

2. The tin-silver plating solution according to claim 1, wherein the source of tin ions includes any one or more water-soluble tin compounds selected from the group consisting of tin sulfate, tin hydrochloride, tin sulfamate, tin acetate, tin phosphate, tin methanesulfonate, tin gluconate, and tin carboxylate.

3. The tin-silver plating solution according to claim 1, wherein the source of silver ions ($Ag^+$) includes any one or more water-soluble silver (Ag) compounds selected from the group consisting of silver sulfate, silver hydrochloride, silver sulfamate, silver acetate, silver phosphate, silver methanesulfonate, silver gluconate, and silver carboxylate.

4. The tin-silver plating solution according to claim 1, wherein tin ions and silver ions ($Ag^+$) in the tin-silver plating solution are provided at a weight ratio of 75:25 to 99.9:0.1.

5. The tin-silver plating solution according to claim 1, wherein the source of silver ions ($Ag^+$) and the silver (Ag) complexing agent are provided at a molar ratio of 1:1 to 1:10.

6. The tin-silver plating solution according to claim 1, further comprising any one or more of a conductive salt, an antioxidant, or a smoothing agent.

7. The tin-silver plating solution according to claim 6, wherein the conductive salt is any one of a hydroxycarboxylic acid or an alkanesulfonic acid.

8. The tin-silver plating solution according to claim 6, wherein the antioxidant is any one or more selected from the group consisting of catechol, hydroquinone, resorcinol, cresol, phloroglucinol, oxy hydroquinone, and pyrogallol.

9. The tin-silver plating solution according to claim 6, wherein the smoothing agent is any one or more selected from the group consisting of a nonionic surface active agent, a cationic surface active agent, an anionic surface active agent, and a synthetic polymer.

10. A method of forming a tin-silver solder bump, the method comprising:

exposing an under-bump-metallurgy structure to a plating bath containing a tin-silver plating solution that contains a source of tin ions; a source of silver ions ($Ag^+$); and an organic additive, the organic additive including a silver (Ag) complexing agent represented by the following Chemical Formula 1, a tin carrier represented by the following Chemical Formula 2, and a crystal grain refiner represented by the following Chemical Formula 3; and plating a tin-silver alloy on the under-bump-metallurgy structure by applying a current:

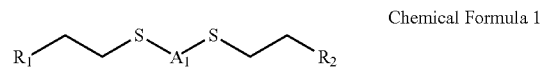

Chemical Formula 1 where $A_1$ is a linear alkylene having 1 to 10 carbon atoms and $R_1$ and $R_2$ are each a functional group containing any one or more of carbon, oxygen, nitrogen, sulfur, or silicon;

Chemical Formula 2

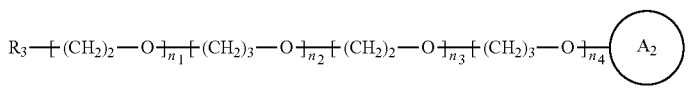

where
- $A_2$ is an unsubstituted $C_6$ to $C_{30}$ aryl group or a heteroaryl group having 6 to 30 ring atoms including a hetero atom in which one or more ring carbon atoms are each composed of any one or more of nitrogen, oxygen, or sulfur,
- $R_3$ is any one of hydrogen, a substituted or unsubstituted $C_1$ to $C_{30}$ alkyl group, a substituted or unsubstituted $C_3$ to $C_{30}$ cycloalkyl group, a substituted or unsubstituted $C_2$ to $C_{30}$ alkenyl group, a substituted or unsubstituted $C_2$ to $C_{30}$ alkynyl group, a substituted or unsubstituted $C_1$ to $C_{30}$ alkoxy group, a hydroxyl group, a sulfonate group having an ionic bond with an alkali metal cation, a phosphonate group having an ionic bond with an alkali metal cation, a nitronate group having an ionic bond with an alkali metal cation, or a carboxylate group having an ionic bond with an alkali metal cation, and
- $n_1$ to $n_4$ are each independently an integer of 0 to 26, provided that a sum of $n_1$ to $n_4$ is 10 to 26; and Chemical Formula 3

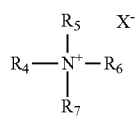

where $R_4$ is hydrogen, a linear alkyl having 1 to 20 carbon atoms, a branched alkyl having 5 to 20 carbon atoms, or a linear alkyl having 1 to 7 carbon atoms including a hydroxyl group, $R_5$ is hydrogen, a linear alkyl having 1 to 20 carbon atoms, a branched alkyl having 5 to 20 carbon atoms, or a linear alkyl having 1 to 7 carbon atoms including a hydroxyl group, $R_6$ is hydrogen, a linear alkyl having 1 to 20 carbon atoms, or a branched alkyl having 5 to 20 carbon atoms, $R_7$ is hydrogen, a linear alkyl having 1 to 20 carbon atoms, or a branched alkyl having 5 to 20 carbon atoms, and X is any one selected from the ion group consisting of chlorine (Cl), bromine (Br), iodine (I), a nitrate ($NO_3$), a sulfate ($SO_4$), a carbonate ($CO_3$), and a hydroxyl group (OH).

11. The method of forming a tin-silver solder bump according to claim 10,
wherein the current applied in the step of plating a tin-silver alloy has a current density of 1 ASD to 10 ASD.

* * * * *